(12) United States Patent
Chin et al.

(10) Patent No.: US 10,389,099 B2
(45) Date of Patent: Aug. 20, 2019

(54) CIRCUIT ASSEMBLY

(71) Applicants: AUTONETWORKS TECHNOLOGIES, LTD., Yokkaichi-shi, Mie (JP); SUMITOMO WIRING SYSTEMS, LTD., Yokkaichi-shi, Mie (JP); SUMITOMO ELECTRIC INDUSTRIES, LTD., Osaka-shi, Osaka (JP)

(72) Inventors: Tou Chin, Yokkaichi (JP); Arinobu Nakamura, Yokkaichi (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/084,838

(22) PCT Filed: Feb. 28, 2017

(86) PCT No.: PCT/JP2017/007670
§ 371 (c)(1),
(2) Date: Sep. 13, 2018

(87) PCT Pub. No.: WO2017/159341
PCT Pub. Date: Sep. 21, 2017

(65) Prior Publication Data
US 2019/0081468 A1    Mar. 14, 2019

(30) Foreign Application Priority Data
Mar. 16, 2016 (JP) .................... 2016-052487

(51) Int. Cl.
*H05K 1/14* (2006.01)
*H02G 3/16* (2006.01)
(Continued)

(52) U.S. Cl.
CPC .............. *H02G 3/16* (2013.01); *H05K 1/14* (2013.01); *H05K 1/18* (2013.01); *H05K 7/06* (2013.01)

(58) Field of Classification Search
CPC .......... H05K 1/00; H05K 1/02; H05K 1/0263; H05K 2201/10272; H02G 5/00; H02G 5/007; H02G 5/0025
(Continued)

(56) References Cited

U.S. PATENT DOCUMENTS 6,320,748 B1 * 11/2001 Roden .................. H01L 23/367
165/185
2003/0137813 A1 * 7/2003 Onizuka .............. H05K 1/0263
361/777
(Continued)

FOREIGN PATENT DOCUMENTS

JP    2001-036001 A    2/2001
JP    2001-275230 A    10/2001
(Continued)

OTHER PUBLICATIONS

May 23, 2017 International Search Report issued in International Patent Application No. PCT/JP2017/007670.

*Primary Examiner* — Tuan T Dinh
(74) *Attorney, Agent, or Firm* — Oliff PLC (57) ABSTRACT

A circuit assembly includes: a circuit substrate that has an upper surface on which a circuit pattern has been formed; a plurality of bus bars that are connected to the circuit substrate, and are fixed to a lower surface of the circuit substrate, the plurality of bus bars being spaced apart from (Continued)

each other; an electronic component that includes a package disposed on the bus bar, and a terminal provided within a contour of a lower surface of the package; a sheet substrate that includes one end connected to the terminal and the other end disposed outside the contour of the lower surface of the package; and a pressure-sensitive adhesive sheet that bonds the circuit substrate and the sheet substrate to the plurality of bus bars.

2 Claims, 11 Drawing Sheets (51) Int. Cl.
*H05K 1/18* (2006.01)
*H05K 7/06* (2006.01)

(58) Field of Classification Search
USPC .............. 361/775–778, 803, 813; 439/76.2
See application file for complete search history.

(56) References Cited

U.S. PATENT DOCUMENTS

| 2016/0234928 A1* | 8/2016 | Nakamura | B60R 16/0238 |
| 2016/0242275 A1* | 8/2016 | Nakamura | H05K 1/0263 |
| 2017/0047720 A1 | 2/2017 | Kobayashi et al. | |

FOREIGN PATENT DOCUMENTS

| JP | 2003-164040 A | 6/2003 |
| JP | 2005-348495 A | 12/2005 |
| JP | 2015-216754 A | 12/2015 |
| JP | 2016-092039 A | 5/2016 |

* cited by examiner

CIRCUIT ASSEMBLY

TECHNICAL FIELD

The present disclosure relates to a circuit assembly.

The present application claims priority of Japanese Patent Application No. 2016-052487 filed on Mar. 16, 2016. The entire disclosure of the above-identified application is incorporated herein by reference in its entirety.

BACKGROUND ART

An automobile may be equipped with an electric connection box (also called power distributor) that distributes electric power from a power supply (battery) to loads such as headlamps and windshield wipers. As a member that constitutes an internal circuit of the electric connection box, for example, a circuit assembly as disclosed in Patent Document 1 may be used.

This circuit assembly includes: a control circuit substrate on which a conductor pattern (circuit pattern) has been formed; an input terminal bus bar and an output terminal bus bar that are bonded to the control circuit substrate; and a field effect transistor (FET: electronic component) that is mounted on the control circuit substrate and the two bus bars. The FET includes a main body (package), a source terminal and a gate terminal that protrude from a side surface of the main body and extend downward, and a drain terminal that is provided on the back side of the main body. The drain terminal of the FET is electrically connected to the input terminal bus bar, and the source terminal is electrically connected to the output terminal bus bar. The gate terminal of the FET is formed by being bent at a position upward relative to the source terminal by an amount corresponding to the thickness of the control circuit substrate, and is electrically connected to the conductor pattern of the control circuit substrate disposed on the output terminal bus bar (see paragraphs 0036 to 0039 in the specification, and FIG. 4).

CITATION LIST

Patent Document

Patent Document 1: JP 2003-164040 A

SUMMARY

A circuit assembly according to the present disclosure includes: a circuit substrate that has an upper surface on which a circuit pattern has been formed; a plurality of bus bars that are connected to the circuit substrate, and are fixed to a lower surface of the circuit substrate, the plurality of bus bars being spaced apart from each other; an electronic component that includes a package disposed on the bus bar, and a terminal provided within a contour of a lower surface of the package; a sheet substrate that has one end connected to the terminal and another end disposed outside the contour of the lower surface of the package; and a pressure-sensitive adhesive sheet that bonds the circuit substrate and the sheet substrate to the plurality of bus bars.

DESCRIPTION OF EMBODIMENTS

Technical Problem

In the electronic component described above, because the source terminal and the gate terminal extend downward from the side surface of the package, the terminal lengths are long. For this reason, a large loss is produced when the electric resistances of the terminals increase. In addition, because the distance from the terminal to the bus bar is long, it is difficult to improve heat dissipation properties.

To address the above problems, development has been conducted for a leadless electronic component in which a terminal is provided within the contour of the lower surface of the package. With such an electronic component, because the terminal length is short, the loss can be easily reduced, and heat dissipation properties are likely to be improved. However, when the electronic component is disposed on a bus bar, it is difficult to electrically connect the terminal provided within the contour of the lower surface of the package to a circuit pattern or the like of the circuit substrate provided outside the contour.

Accordingly, it is an object of the present disclosure to provide a circuit assembly in which a terminal provided within the contour of the lower surface of an electronic component can be electrically connected to a connection target provided outside the contour.

Advantageous Effects

With the circuit assembly according to the present disclosure, it is possible to electrically connect the terminal provided within the contour of the lower surface of the electronic component to the connection target provided outside the contour.

Description of Embodiments

First, aspects according to a preferred embodiment are listed and described.

A circuit assembly according to one aspect of a preferred embodiment includes: a circuit substrate that has an upper surface on which a circuit pattern has been formed; a bus bar including a plurality of bus bars that are connected to the circuit substrate, and are fixed to a lower surface of the circuit substrate, the plurality of bus bars being spaced apart from each other; an electronic component that includes a package disposed on the bus bar, and a terminal provided within a contour of a lower surface of the package; a sheet substrate that includes one end connected to the terminal and the other end disposed outside the contour of the lower surface of the package; and a pressure-sensitive adhesive sheet that bonds the circuit substrate and the sheet substrate to the plurality of bus bars.

With the configuration described above, because the sheet substrate is included, the terminal provided within the contour of the lower surface of the electronic component can be electrically connected to a connection target provided outside the contour.

Also, with the configuration described above, because the pressure-sensitive adhesive sheet that bonds the circuit substrate and the sheet substrate to the plurality of bus bars is included, these members can be unitarily fixed by simply stacking them, and thus excellent assembling operation efficiency is obtained.

Furthermore, with the configuration described above, because the electronic component includes the terminal provided within the contour of the lower surface of the package, the terminal length can be shortened, and thus the electric resistance can be reduced and the loss is likely to be reduced. In addition, heat dissipation properties are likely to be improved.

(2) As another aspect of the circuit assembly described above, the bus bar includes a recessed portion that is formed in an overlapping region of the bus bar that overlaps with the terminal of the electronic component, the recessed portion reducing a height difference with respect to a surrounding region where the sheet substrate is not disposed.

With the configuration described above, even when the electronic component includes a terminal that is provided within the contour of the lower surface of the package but is electrically and mechanically connected to the bus bars without being electrically and mechanically connected to the sheet substrate, the height difference in the up-down direction between both terminals is likely to be reduced. This is because an overlapping region of the sheet substrate that overlaps with the recessed portion or cutout portion can be easily embedded into the recessed portion or cutout portion by the weight of the electronic component.

Detailed Description of Embodiments

Hereinafter, embodiments according to a preferred embodiment will be described in detail with reference to the drawings. In the diagrams, the same reference numerals indicate the same components.

Embodiment 1

Circuit Assembly

A circuit assembly 1A according to Embodiment 1 will be described with reference to FIGS. 1 to 5. The circuit assembly 1A includes a circuit substrate 2 that has a circuit pattern (not shown), a plurality of bus bars 3 that are fixed to the circuit substrate 2, and an electronic component 4 that has a terminal provided within the contour of the lower surface of a package 40. A feature of the circuit assembly 1A is that the circuit assembly 1A includes a sheet substrate 5 that electrically connects a terminal provided within the contour (footprint) of the lower surface of the package 40 to a connection target provided outside the contour, and a pressure-sensitive adhesive sheet 6 that bonds the sheet substrate 5 to the bus bar 3. Hereinafter, a detailed description will be given. In the following description, for the sake of convenience of description, the side on which the circuit substrate 2 of the circuit assembly 1A is provided is defined as "up", and the side on which the bus bar 3 is provided is defined as "down". The direction in which the plurality of bus bars 3 are disposed side by side is defined as "front rear direction", and a direction perpendicular to the up-down direction and the front-rear direction is defined as "right-left direction".

Circuit Substrate

Figure 1:
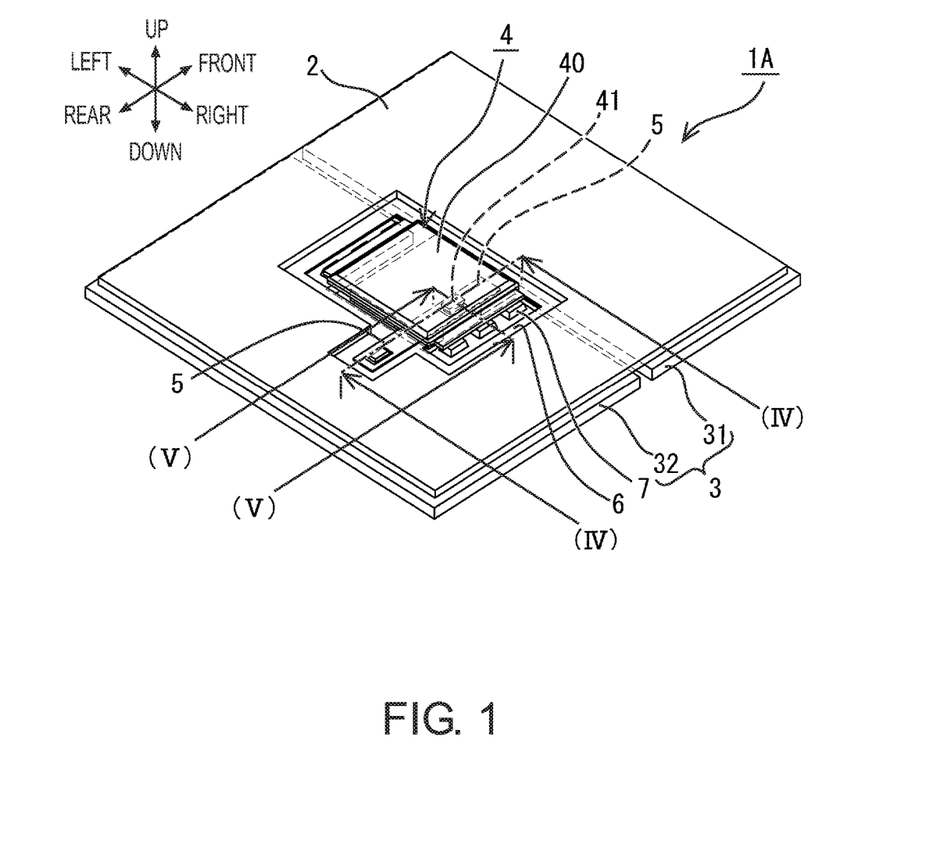
FIG. 1 is a schematic perspective view of a circuit assembly according to Embodiment 1.
Figure 2:
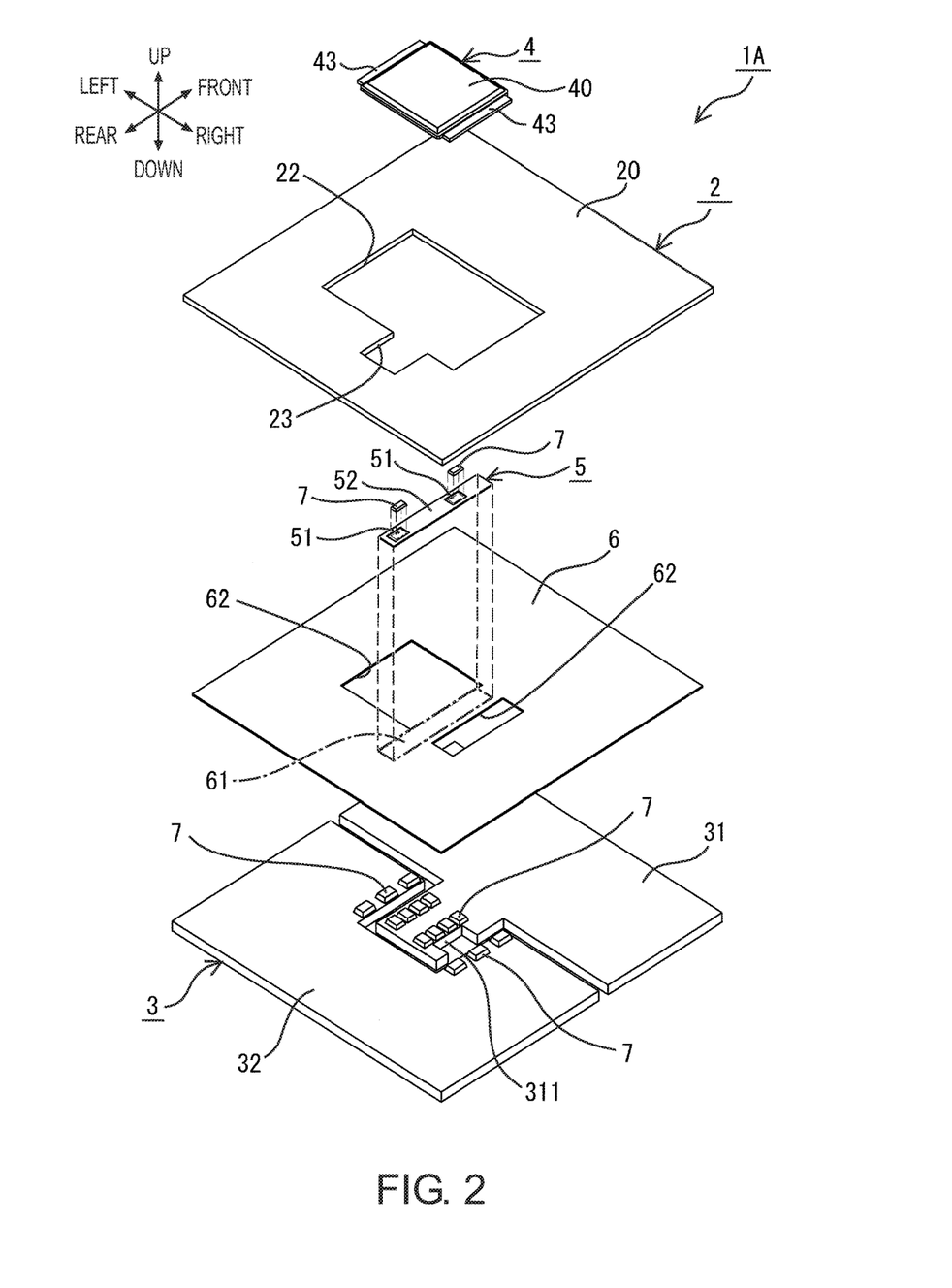
FIG. 2 is a schematic exploded perspective view of the circuit assembly according to Embodiment 1.

The circuit substrate 2 includes an insulating substrate 20, and a circuit pattern that is formed on one side (upper surface) of the insulating substrate 20 and to which the electronic component 4 is electrically connected (FIGS. 1 and 2). It is also possible to form a circuit pattern on the other side (lower surface) of the insulating substrate 20. The circuit pattern is made of a copper foil. As the circuit substrate 2, a printed circuit board may be used. The bus bar 3 is fixed to the other side (lower surface) of the insulating substrate 20. The insulating substrate 20 has a mounting through hole 22 for mounting the electronic component 4 on the bus bar 3, and a connecting through hole 23 for electrically connecting the electronic component 4 to the circuit pattern. The mounting through hole 22 and the connecting through hole 23 are formed continuously. The through holes 22 and 23 have contour shapes of different sizes such as large and small rectangular shapes.

Bus Bar

The bus bar 3 constitutes an electric power circuit (FIGS. 1 and 2). The bus bar 3 is connected to a power supply and electric loads. The material of the bus bar 3 may be an electrically conductive metal. Specific examples include copper, a copper alloy, and the like. The bus bar 3 includes a plurality of bus bars. The plurality of bus bars 3 (31 and 32) are fixed to the other side (lower surface) of the circuit substrate 2 and are spaced apart from each other (FIG. 2). The plurality of bus bars 3 can be fixed to the circuit substrate 2 by using a pressure-sensitive adhesive sheet 6 interposed between the bus bar 3 and the circuit substrate 2, which will be described later. A first bus bar 31 is a T-shaped plate, and a second bus bar 32 has a U-shape. The projecting portion of the T-shaped first bus bar 31 is disposed in the dented portion of the U-shaped second bus bar 32.

The projection portion of the first bus bar 31 may be provided with a recessed portion for reducing the height difference with respect to the surrounding region of the bus bar 3 (31) where the sheet substrate 5 is not disposed. The recessed portion may be formed by any of cutting-out, embossing, and thinning as long as a depressed area can be formed from the sheet substrate 5 side toward the opposite side. In this example, the recessed portion is formed by a bus bar cutout portion 311.

The bus bar cutout portion 311 diminishes the height difference between an area where the sheet substrate 5 is present and an area where the sheet substrate 5 is not present. This is because an overlapping region of the sheet substrate 5 that overlaps with the bus bar cutout portion 311 can easily become embedded in the bus bar cutout portion 311 by the weight of the electronic component 4.

Figure 4:
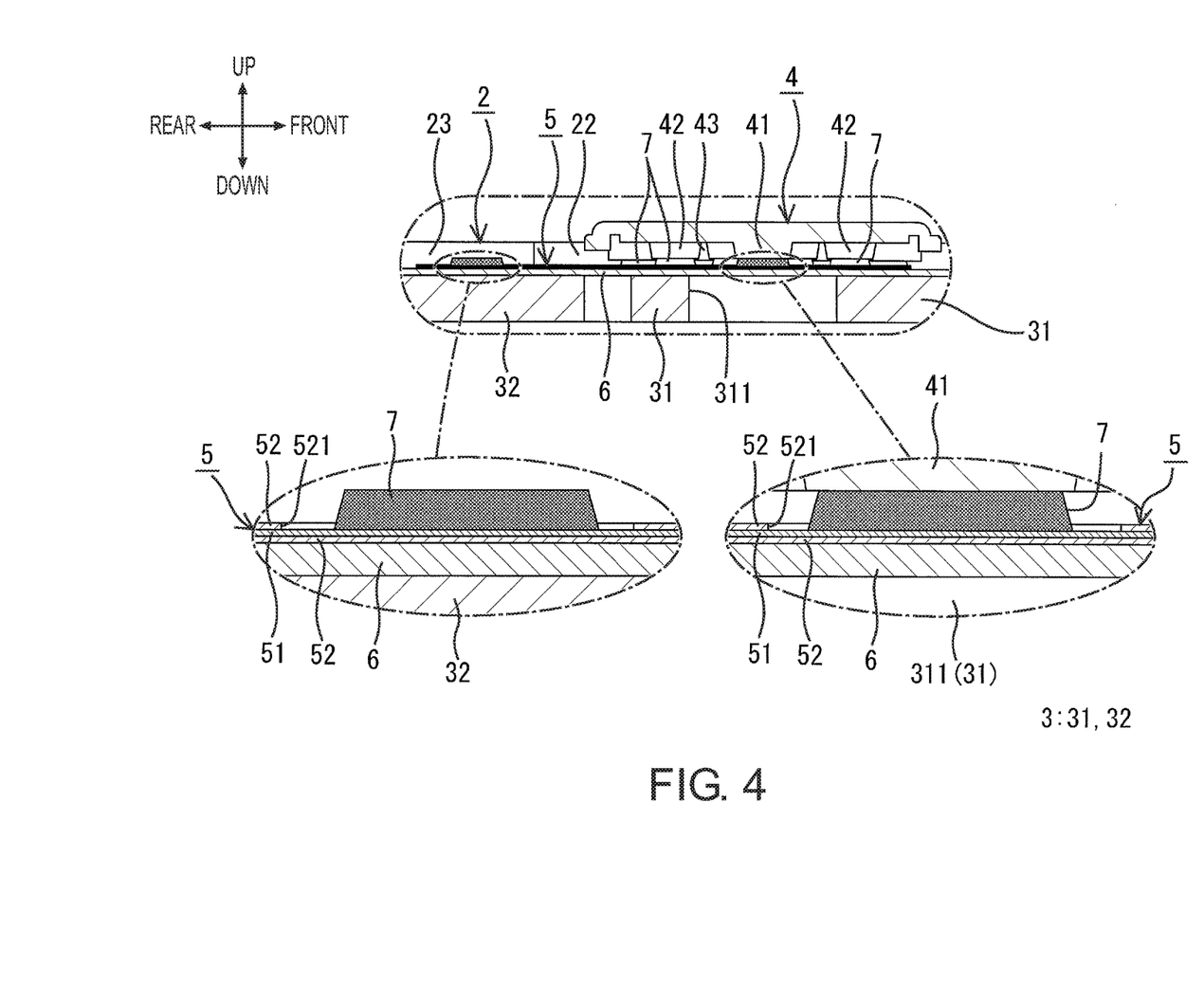
FIG. 4 is a cross-sectional view of the circuit assembly shown in FIG. 1 taken along the cutting line (IV)-(IV) in FIG. 1.
Figure 5:
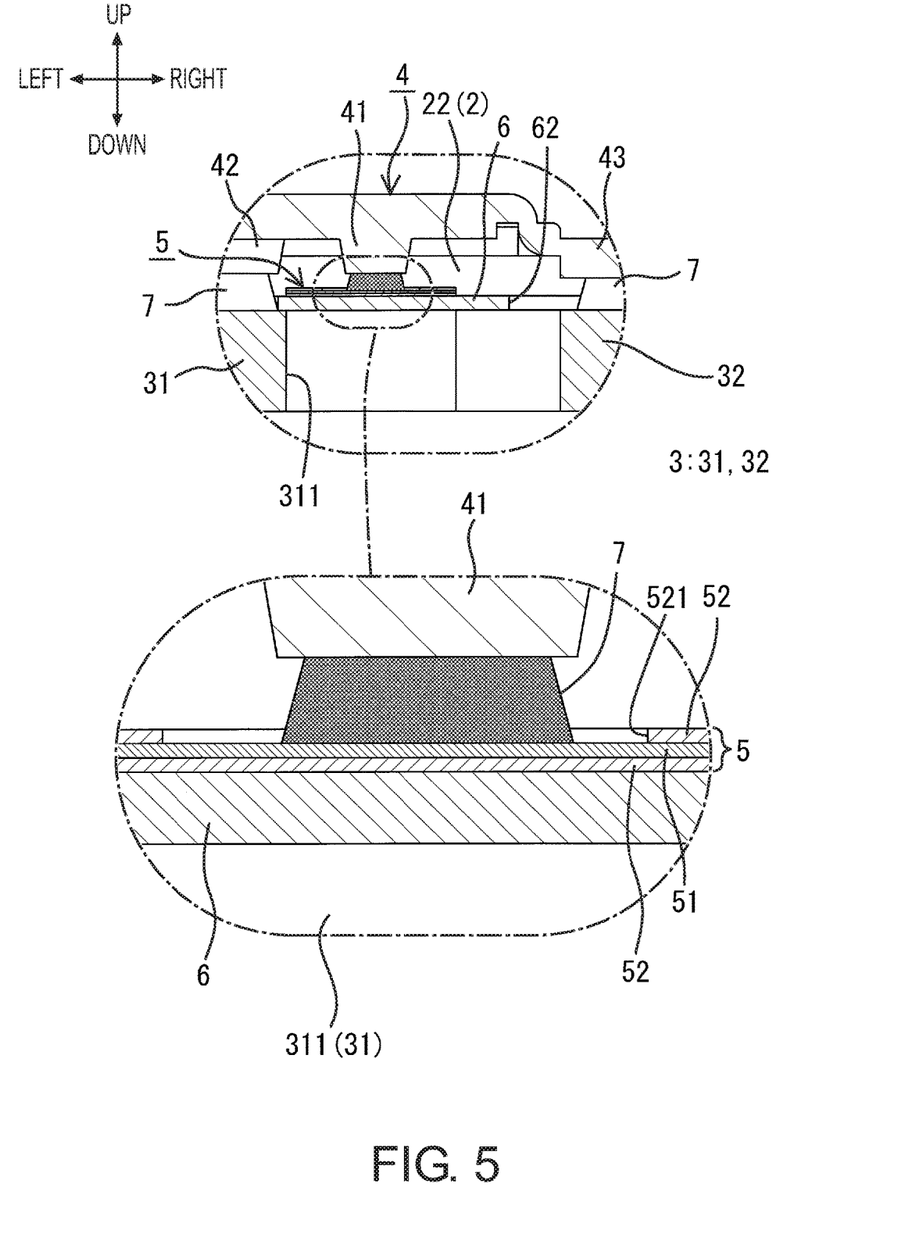
FIG. 5 is a cross-sectional view of the circuit assembly shown in FIG. 1 taken along the cutting line (V)-(V) in FIG. 1.

The bus bar cutout portion 311 is larger than a terminal (first terminal 41) provided within the contour of the lower surface of the electronic component 4 that overlaps with the bus bar cutout portion 311 (FIGS. 1, 4, and 5). FIG. 4 is a cross-sectional view of the circuit assembly 1A taken along a cutting line passing through the center of the sheet substrate 5 in the lengthwise direction, and FIG. 5 is a cross-sectional view of the circuit assembly 1A taken along a cutting line passing through the center of the sheet substrate 5 in the transverse direction. As shown in FIG. 4, a region where the bus bar cutout portion 311 is formed in the front-rear direction is an intermediate region of the projecting portion of the first bus bar 31. As shown in FIG. 5, a region where the bus bar cutout portion 311 is formed in the right-left direction is a region extending from the right side edge of the projecting portion of the first bus bar 31 to a position between the first terminal 41 and a second terminal 42 that is adjacent to the first terminal 41. The region where the bus bar cutout portion 311 is formed in the up-down direction extends from top to bottom of the first bus bar 31.

Electronic Component

Figure 3:
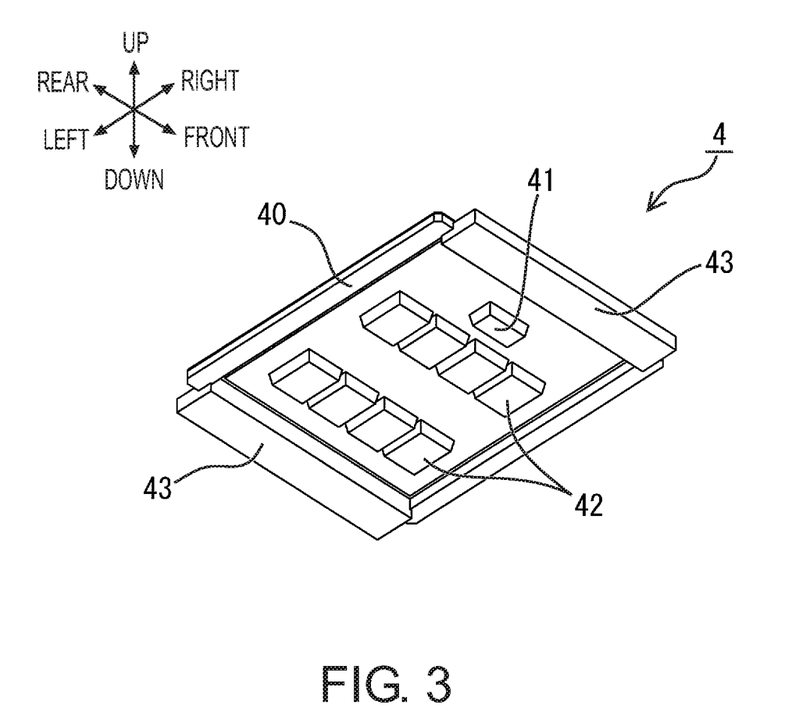
FIG. 3 is a schematic perspective view of a lower surface of an electronic component included in the circuit assembly according to Embodiment 1.

The electronic component 4 is mounted on both the sheet substrate 5 and the bus bar 3 (FIGS. 1 to 3). The electronic component 4 may be, for example, a switching element such as a relay or a field effect transistor (FET). The electronic component 4 includes a package 40 disposed on the bus bar 3, and a terminal disposed within the contour of the lower surface of the package 40. It is possible to provide a plurality of terminals within the contour of the lower surface of the package 40. If a plurality of terminals are disposed within the contour of the lower surface of the package 40, the plurality of terminals may be of the same type or of different types. The electronic component 4 may also include, other than the terminals disposed within the contour of the lower surface of the package 40, a terminal that juts out from the contour of the lower surface, or a terminal that is disposed on a surface (side surface) other than the lower surface.

In this example, the electronic component 4 includes a total of three different types of terminals; two types of terminals (first terminal 41 and second terminal 42) that are disposed within the contour of the lower surface of the package 40; and a third terminal 43 that is disposed outside the contour of the lower surface of the package 40 (FIG. 3). An FET is used as the electronic component 4. The first (type of) terminal 41 is a gate terminal, and only one first terminal is provided. The second terminal is a source terminal, and eight second terminals are provided. The third terminal is a drain terminal, and two third terminals are provided. The first terminal 41 overlaps with the bus bar cutout portion 311 of the first bus bar 31, and is electrically and mechanically connected to a terminal conductor foil 51 (described later) of the sheet substrate 5 on the pressure-sensitive adhesive sheet 6 (FIGS. 1, 4, and 5). The eight second terminals 42 are electrically and mechanically connected to the first bus bar 31 (FIGS. 2 and 3). The two third terminals 43 are formed unitarily with the package 40 at opposing positions across the package 40, and are electrically and mechanically connected to the second bus bar 32, which is different from the bus bar to which the second terminals 42 are connected (FIG. 1).

To implement the electric and mechanical connection, it is possible to use a metal connection material, typically solder 7 (FIG. 2). In this example, the connection using solder 7 is performed by reflowing. That is, a solder paste is applied (printed) to predetermined positions in advance before the electronic component 4 is placed on the bus bars 31 and 32 and the sheet substrate 5. Then, the electronic component 4 is placed on the solder paste, and thereafter heated so as to connect the electronic component 4 to the bus bars 31 and 32, and the sheet substrate 5.

Sheet Substrate

The sheet substrate 5 includes one end that is electrically and mechanically connected to the terminal (the first terminal 41) provided within the contour of the lower surface of the electronic component 4, and the other end that is disposed outside the contour of the lower surface of the package 40 (FIGS. 1 and 2). With this configuration, it is possible to electrically connect the terminal provided within the contour of the lower surface of the electronic component 4 to a connection target provided outside the contour. In FIG. 2, for the sake of convenience of description, a sheet substrate placement region 61 (described later), which is a region of the pressure-sensitive adhesive sheet 6 on which the sheet substrate 5 is provided, is indicated by a dash-dot-dot line. One end of the sheet substrate 5 is disposed on the lower surface of the package 40 (the electronic component 4), and the other end of the sheet substrate 5 extends away from the lower surface of the electronic component 4 and is disposed outside the contour of the lower surface. The other end of the sheet substrate 5 is electrically connected to the circuit pattern of the circuit substrate 2 by, for example, an electrically conductive member such as a jumper chip.

The sheet substrate 5 has a strip shape. The sheet substrate 5 is bonded to the upper surface of the pressure-sensitive adhesive sheet 6 (described later) that is bonded to the upper surface of the bus bar 3. The area of the pressure-sensitive adhesive sheet 6 on which the sheet substrate 5 is disposed extends from the inside to the outside of the contour of the lower surface of the package 40 (the electronic component 4) and extends from the projecting portion of the first bus bar 31 to the upper surface of the second bus bar 32 via the bus bar cutout portion 311. That is, a portion of the sheet substrate 5 overlaps with the bus bar cutout portion 311.

The sheet substrate 5 has a thickness that is sufficiently thinner than the thickness of the circuit substrate 2. With the sheet substrate 5 being sufficiently thin, the height difference in the thickness direction of the circuit assembly 1A between the first terminal 41 and the second terminal 42 can be reduced. The sheet substrate 5 preferably has a thickness of, for example, about 150 μm or less. When the sheet substrate 5 has a thickness of 150 μm or less, the sheet substrate 5 is not too thick, and thus the height difference can be easily reduced. The sheet substrate 5 has a thickness of, for example, 30 μm or more. When the sheet substrate 5 has a thickness of 30 μm or more, a terminal conductor foil 51 and an insulating layer 52, which will be described later, can be formed to have an intended thicknesses, and the electric connection, electric insulation, and bonding functions are easily attained.

The sheet substrate 5 is preferably flexible. With a flexible sheet substrate 5, it is possible to reduce the height difference, or even substantially eliminate the height difference. With a flexible sheet substrate 5, the overlapping region of the sheet substrate 5 that overlaps with the bus bar cutout portion 311 can be embedded into the bus bar cutout portion 311 by the weight of the electronic component 4.

The sheet substrate 5 includes a terminal conductor foil 51 and an insulating layer 52 (FIGS. 4 and 5). The terminal conductor foil 51 and the insulating layer 52 are bonded by a bonding layer (not shown) interposed therebetween. As the sheet substrate 5, a flexible printed circuit (FPC) board can be used.

Terminal Conductor Foil

The terminal conductor foil 51 electrically connects the terminal (the first terminal 41) provided within the contour of the lower surface of the electronic component 4 to the circuit pattern. The terminal conductor foil 51 may be a copper foil. The terminal conductor foil 51 has a rectangular strip shape.

A region of the terminal conductor foil 51 excluding a portion of the upper surface on one end side of the terminal conductor foil 51 and a portion of the upper surface on the other end side is covered with the insulating layer 52 (FIGS. 2, 4, and 5). That is, the lower surface and the side surfaces of the terminal conductor foil 51 are entirely covered with the insulating layer 52. One end side of the terminal conductor foil 51 is exposed from the insulating layer 52 via an opening portion 521 formed in the insulating layer 52, and is electrically and mechanically connected to the first terminal 41. The exposed area of the one end side of the terminal conductor foil 51 overlaps with the bus bar cutout portion 311. As with the one side end, the other end side of the terminal conductor foil 51 is exposed from the insulating layer 52, and extends away from the lower surface of the electronic component 4 to the connecting through hole 23. The other end side of the terminal conductor foil 51 can be electrically connected to the circuit pattern formed on the circuit substrate 2 or the like via, for example, an additional electrically conductive member (not shown) such as a jumper chip. To implement the electric and mechanical connection, it is possible to use solder 7.

The terminal conductor foil 51 preferably has a thickness of 10 μm or more. When the terminal conductor foil 51 has a thickness of 10 μm or more, the electric connection to the first terminal 41 and the circuit pattern is easily attained. The terminal conductor foil 51 preferably has a thickness of 70 μm or less. More preferably, the terminal conductor foil 51 has a thickness of 12 μm or more and 35 μm or less.

Insulating Layer

The insulating layer 52 insulates the terminal conductor foil 51 from the bus bar 3 and the electronic component 4 (FIGS. 2, 4, and 5). On the upper surface of the insulating layer 52, opening portions 521 are formed in an area of the terminal conductor foil 51 that overlaps with the terminal (the first terminal 41) provided within the contour of the lower surface of the electronic component 4, and an area for electrically connecting to the circuit pattern of the circuit substrate 2. That is, the covered region of the terminal conductor foil 51 covered with the insulating layer 52 includes a region excluding the above-described two areas on the upper surface of the terminal conductor foil 51, and the entire region of the lower surface and the side surfaces of the terminal conductor foil 51.

The insulating layer 52 preferably has a thickness of 10 μm or more. As used herein, the thickness refers to thickness per side. That is, the total thickness of the insulating layer 52 of the sheet substrate 5 is preferably 20 μm or more. When the insulating layer 52 has a thickness per side of 10 μm or more, electric insulation properties between the terminal conductor foil 51 and the bus bar 3 (31) and between the terminal conductor foil 51 and the electronic component 4 are easily attained. The insulating layer 52 preferably has a thickness per side of 50 μm or less. More preferably, the insulating layer 52 has a thickness per side of 12 μm or more and 30 μm or less.

As the constituent material of the insulating layer 52, a resin that is heat resistant to the solder reflow temperature when mounting the electronic component 4 may be used. The constituent material of the insulating layer 52 may be, for example, a polyimide resin, or the like.

Pressure-Sensitive Adhesive Sheet

The pressure-sensitive adhesive sheet 6 bonds the circuit substrate 2 and the sheet substrate 5 to the plurality of bus bars 3 (FIGS. 1 and 2). The pressure-sensitive adhesive sheet 6 is disposed on the upper surfaces of the bus bars 31 and 32 continuously so as to straddle the bus bars 31 and 32. The pressure-sensitive adhesive sheet 6 includes a sheet substrate placement region 61 on which the sheet substrate 5 is placed (FIG. 2). The sheet substrate placement region 61 is formed so as to extend from the projecting portion of the first bus bar 31 to the second bus bar 32 so as to straddle the bus bar cutout portion 311. That is, a portion of the pressure-sensitive adhesive sheet 6 overlaps with the bus bar cutout portion 311. An opening portion 62 is formed on each of the right and left sides of the sheet substrate placement region 61. The opening portions 62 are provided so as to electrically and mechanically connect, among the terminals of the electronic component 4, terminals (the second terminal 42 and the third terminal 43) other than the terminal (the first terminal 41) that is electrically connected to the circuit pattern formed on the circuit substrate 2 to the bus bar 3. A formation region of the pressure-sensitive adhesive sheet 6 is a region excluding connection areas where the second terminal 42 and the third terminal 43 of the electronic component 4 are connected to the bus bars 31 and 32.

The pressure-sensitive adhesive sheet 6 has a thickness of, for example, 30 μm or more and 150 μm or less. When the pressure-sensitive adhesive sheet 6 has a thickness of 30 μm or more, bonding properties and insulation properties between the circuit substrate 2 and the sheet substrate 5, and the plurality of bus bars 3 are easily increased. When the pressure-sensitive adhesive sheet 6 has a thickness of 150 μm or less, the pressure-sensitive adhesive sheet 6 is not excessively thick, and thus the height difference between the first terminal 41 and the second terminal 42 in the up-down direction thereof can be reduced. More preferably, the pressure-sensitive adhesive sheet 6 has a thickness of 40 μm or more and 100 μm or less.

The constituent material of the pressure-sensitive adhesive sheet 6 may be a resin that has electric insulation properties and is heat resistant to the solder reflow temperature when mounting the electronic component 4. The constituent material of the pressure-sensitive adhesive sheet 6 may be, for example, a high-heat resistant acrylic pressure-sensitive adhesive, or an insulating adhesive such an epoxy resin adhesive.

Applications

The circuit assembly 1A according to Embodiment 1 is suitable for use in an automobile electric connection box. The circuit assembly 1A according to Embodiment 1 is suitable for use as a high current power circuit substrate such as a direct current voltage converting apparatus, an AC/DC converting apparatus, or a DC/AC inverter.

Operations and Advantageous Effects

The circuit assembly 1A according to Embodiment 1 can provide the following advantageous effects.

(1) Because the sheet substrate 5 is provided so as to extend from the inside to the outside of the contour of the lower surface of the electronic component 4, the first terminal 41 provided within the contour of the lower surface of the electronic component 4 can be electrically connected to the connection target provided outside the contour (for example, the circuit pattern formed on the circuit substrate 2). With this configuration, the electric power circuit can constitute a high current circuit substrate without using the circuit substrate 2, and both the electric resistance and thermal resistance can be reduced.

(2) Excellent productivity can be obtained. The circuit substrate 2 and the sheet substrate 5 can be bonded to the bus bar 3 by using the pressure-sensitive adhesive sheet 6. Because these members can be unitarily fixed by simply stacking them, excellent assembling operation efficiency is obtained. Also, the connection of the sheet substrate 5 and the bus bar 3 to the electronic component 4 can be performed by reflowing solder 7, and thus excellent connection operation efficiency of connecting the sheet substrate 5 and the bus bar 3 to the electronic component 4 is obtained.

(3) The height difference between the first terminal 41 and the second terminal 42 in the up-down direction thereof can be easily reduced. Because the first bus bar 31 includes the bus bar cutout portion 311 in the overlapping region with the first terminal 41, the overlapping region of the sheet substrate 5 with the bus bar cutout portion 311 is easily embedded into the bus bar cutout portion 311 by the weight of the electronic component 4.

Embodiment 2

Circuit Assembly

Figure 6:
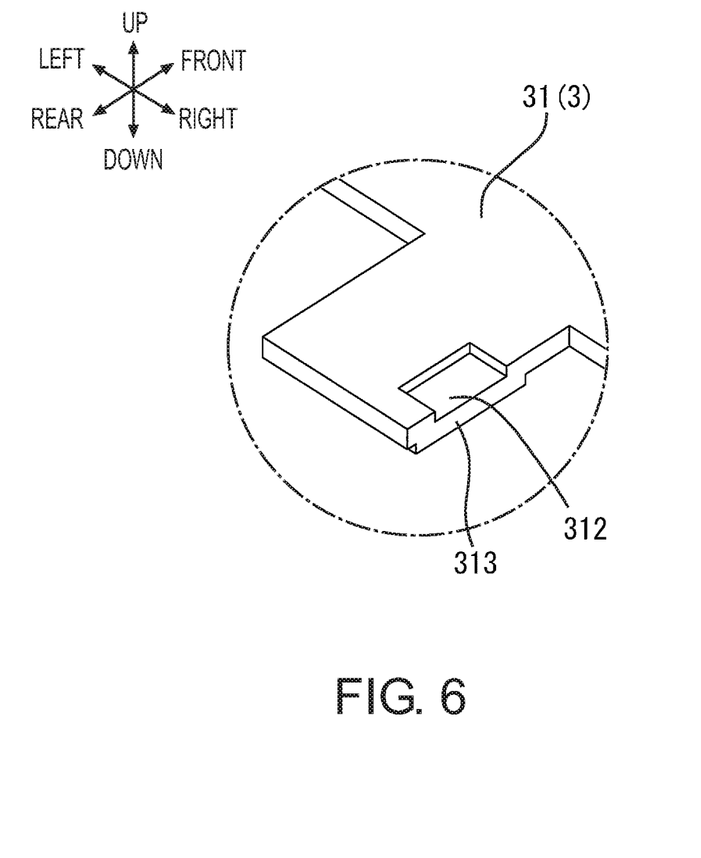
FIG. 6 is a partially enlarged view showing an example of a recessed portion of a bus bar included in a circuit assembly according to Embodiment 2.
Figure 7:
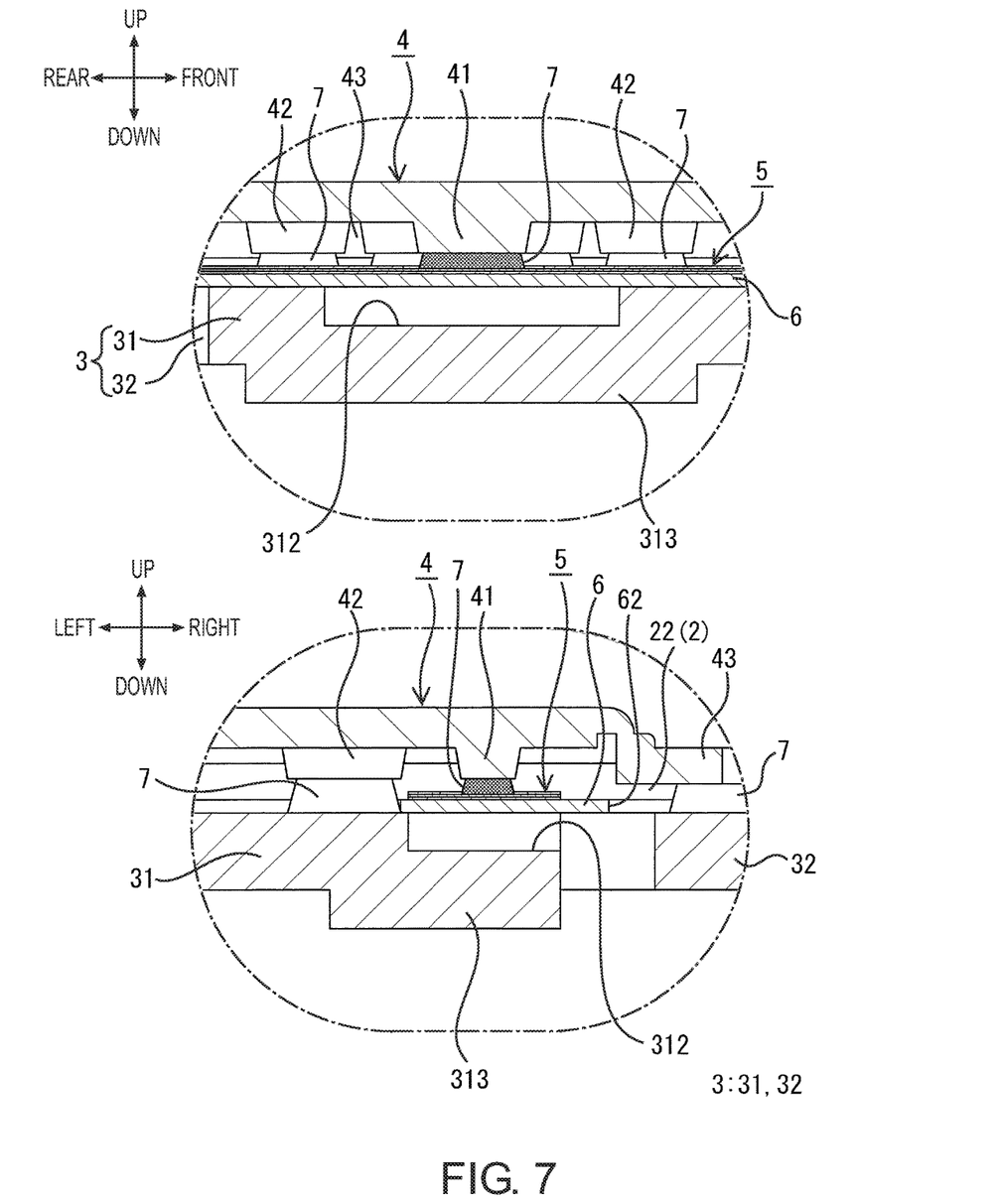
FIG. 7 shows an example of the circuit assembly according to Embodiment 2, with the upper diagram being a cross-sectional view of the circuit assembly taken along a cutting line passing through the center of a sheet substrate in the lengthwise direction, and the lower diagram being a cross-sectional view of the circuit assembly taken along a cutting line passing through the center of the sheet substrate in the transverse direction.
Figure 8:
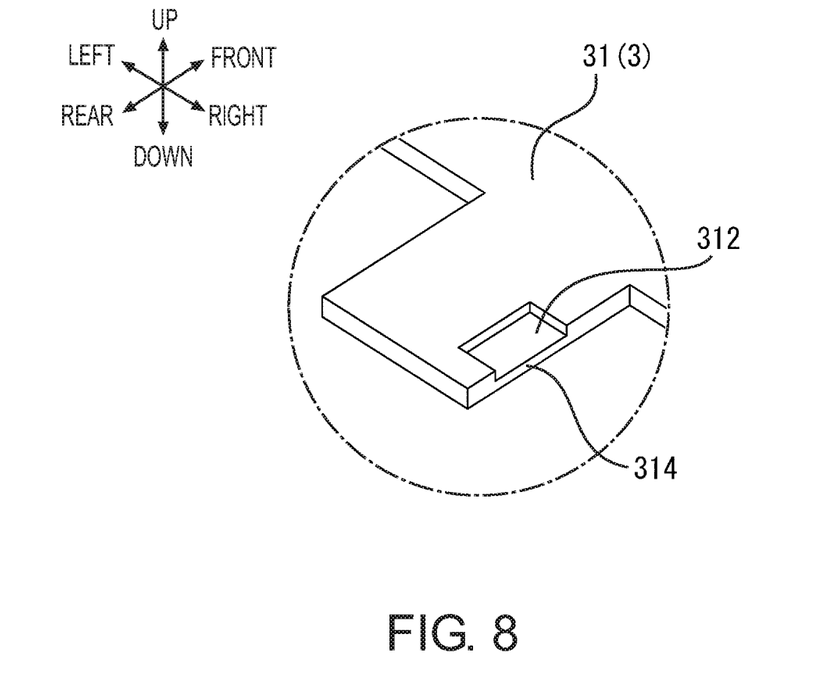
FIG. 8 is a partially enlarged view showing another example of the recessed portion of the bus bar included in the circuit assembly according to Embodiment 2.
Figure 9:
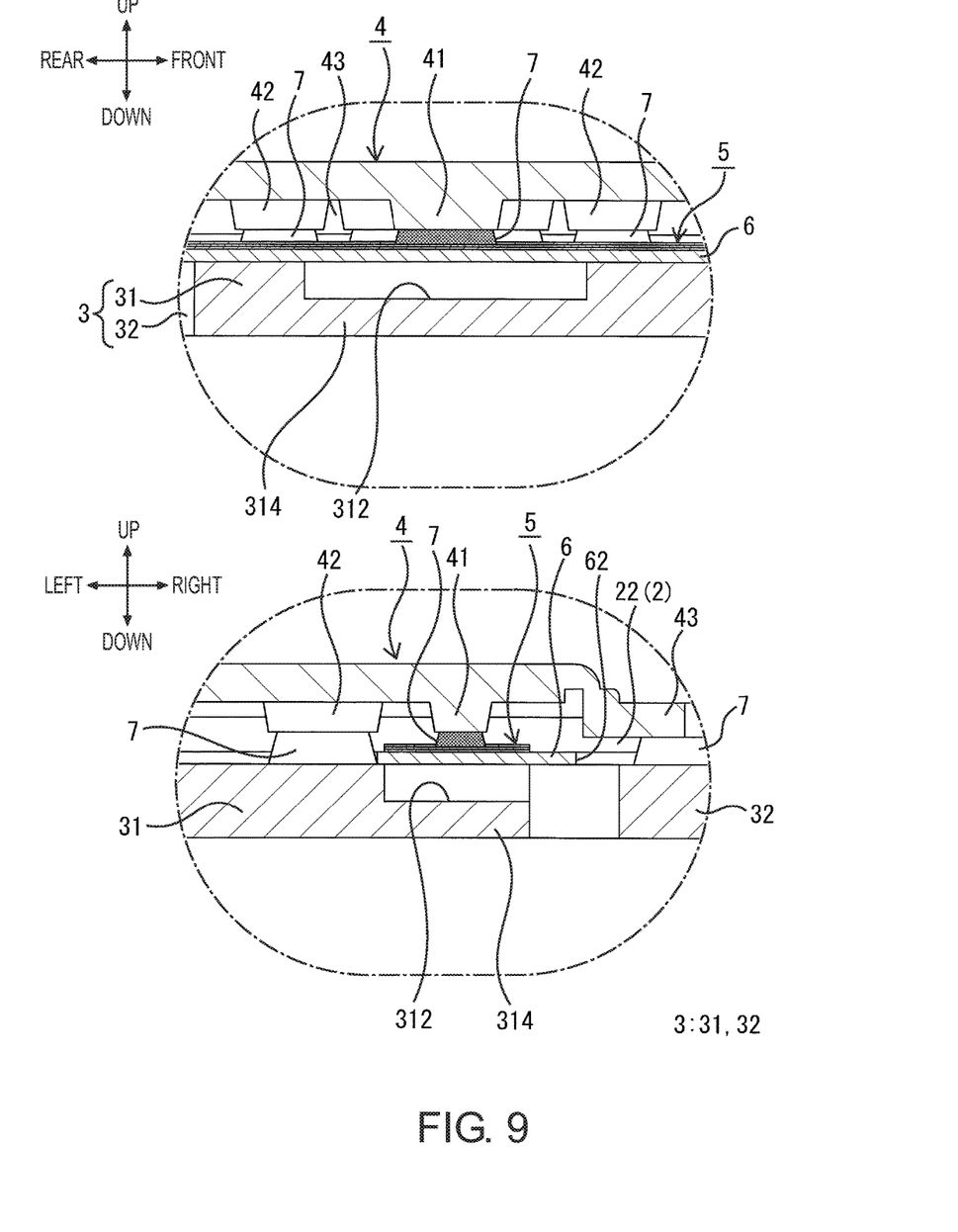
FIG. 9 shows another example of the circuit assembly according to Embodiment 2, with the upper diagram being a cross-sectional view of the circuit assembly taken along a cutting line passing through the center of the sheet substrate in the lengthwise direction, and the lower diagram being a cross-sectional view of the circuit assembly taken along a cutting line passing through the center of the sheet substrate in the transverse direction.

A circuit assembly according to Embodiment 2 will be described with reference to FIGS. 6 to 9. The circuit assembly according to Embodiment 2 is different from the circuit assembly 1A according to Embodiment 1 in that the first bus bar 31 includes a recessed portion 312 instead of the bus bar cutout portion 311 (FIG. 2). Other than this difference, the circuit assembly according to Embodiment 2 has the same configuration as that of the circuit assembly according to Embodiment 1. The following description will be given focusing on the difference, and a description of constituent elements and advantageous effects similar to those of Embodiment 1 will be omitted. The same applies to Modification 1 given later. FIGS. 6 and 8 are enlarged diagrams of the projecting portion of the first bus bar 31. For the sake of convenience of illustration, other members such as the second bus bar 32 are omitted. The upper diagrams in FIGS. 7 and 9 are cross-sectional views of the circuit assembly taken along a cutting line passing through the center of the sheet substrate 5 in the lengthwise direction as in FIG. 4, and the lower diagrams in FIGS. 7 and 9 are cross-sectional views of the circuit assembly taken along a cutting line passing through the center of the sheet substrate 5 in the transverse direction as in FIG. 5.

Bus Bar

The first bus bar 31 includes a recessed portion 312 that forms a clearance between the first bus bar 31 and the pressure-sensitive adhesive sheet 6, which will be described later (FIGS. 6 and 8). As with the bus bar cutout portion 311 (FIG. 2), the recessed portion 312 is formed in an overlapping region that overlaps with the terminal (the first terminal 41) provided within the contour of the lower surface of the electronic component 4. The recessed portion 312 has similar dimensions in the front-rear direction and in the right-left direction to those of the bus bar cutout portion 311. It is preferable that the recessed portion 312 has a depth equal to or greater than the thickness of the sheet substrate 5.

The recessed portion 312 may be formed by embossing the first bus bar 31 from the upper surface side to the lower surface side by using a punch, or may be formed by cutting the upper surface of the first bus bar 31. If the recessed portion 312 is formed by embossing, a protruding portion 313 that protrudes downward from the surrounding region is formed in an area that constitutes the lower surface of the recessed portion 312 (FIGS. 6 and 7). The protruding portion 313 has substantially the same thickness as that of the surrounding region (FIG. 7). On the other hand, if the recessed portion 312 is formed by cutting or the like, a thinly-formed portion 314 that is thinner than the surrounding region is formed in an area that constitutes the lower surface of the recessed portion 312 (FIGS. 8 and 9). In this case, the lower surface of the first bus bar 31 is flat (FIG. 9). The thickness of the thinly-formed portion 314 is preferably adjusted such that the depth of the recessed portion 312 is greater than or equal to the thickness of the sheet substrate 5, and the strength of the thinly-formed portion 314 does not decrease.

Modification 1

Circuit Assembly

Figure 10:
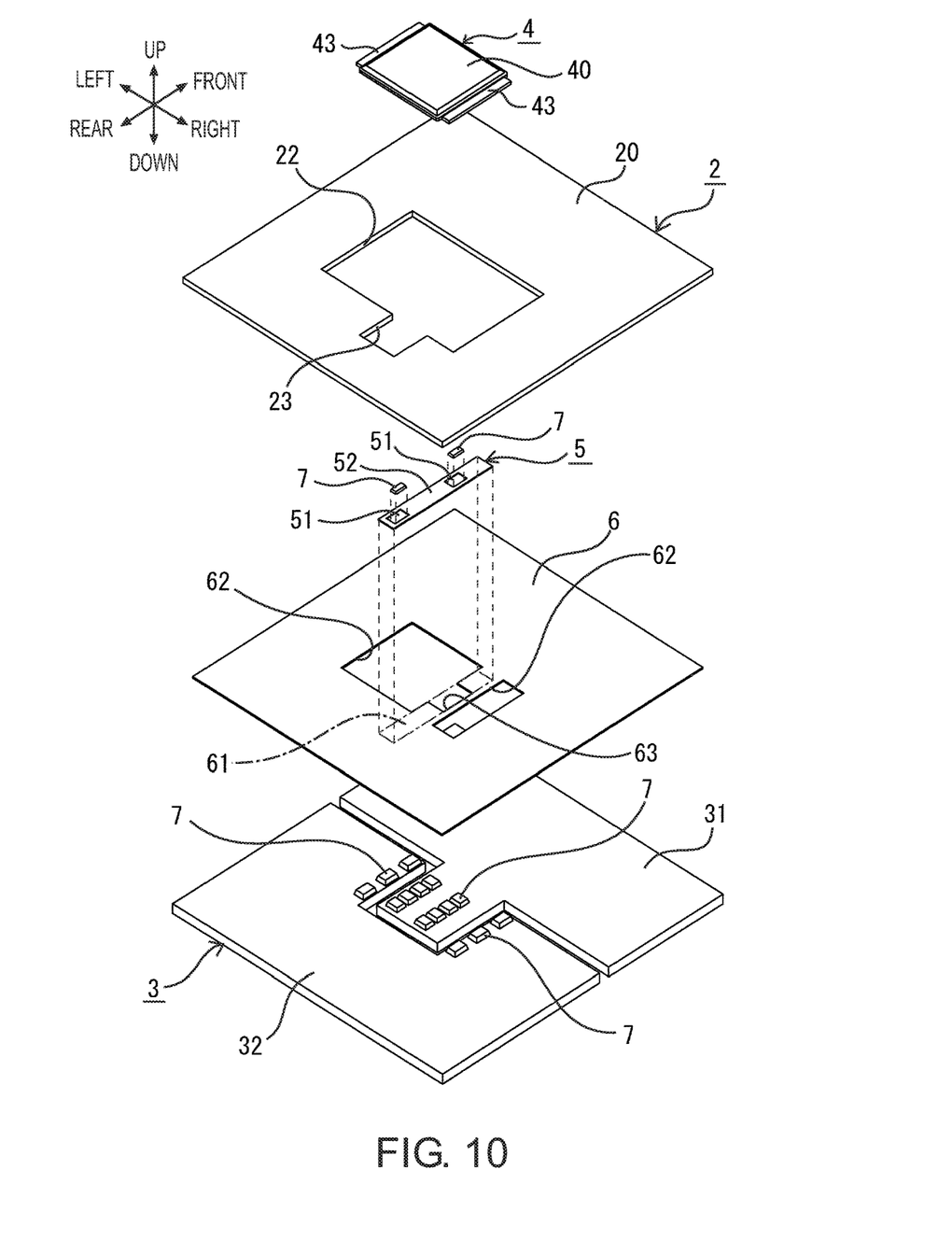
FIG. 10 is a schematic exploded perspective view of a circuit assembly according to Modification 1.
Figure 11:
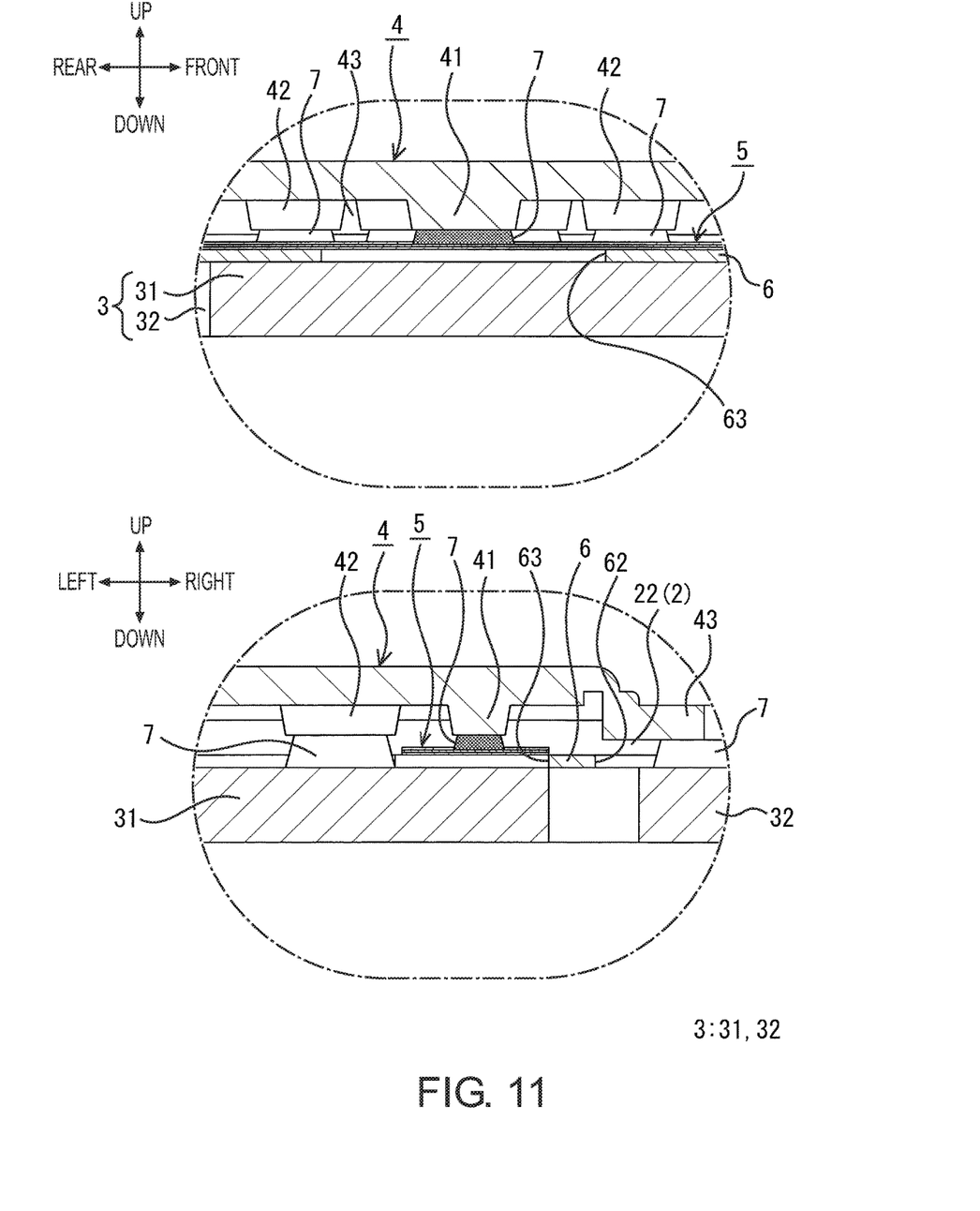
FIG. 11 shows the circuit assembly according to Modification 1, with the upper diagram being a cross-sectional view of the circuit assembly taken along a cutting line passing through the center of a sheet substrate in the lengthwise direction, and the lower diagram being a cross-sectional view of the circuit assembly taken along a cutting line passing through the center of the sheet substrate in the transverse direction.

A circuit assembly according to Modification 1 will be described with reference to FIGS. 10 and 11. The circuit assembly is different from the circuit assembly 1A according to Embodiment 1 primarily in that the pressure-sensitive adhesive sheet 6 includes a pressure-sensitive adhesive sheet cutout portion 63.

Bus Bar

The first bus bar 31 does not include the bus bar cutout portion 311 (FIG. 2) or the recessed portion 312 (FIG. 6). That is, the upper surface and the lower surface of the first bus bar 31 are flat.

Sheet Substrate

The overlapping region of the sheet substrate 5 that overlaps with the first terminal 41 is not bonded to the pressure-sensitive adhesive sheet 6. This is because the overlapping region of the sheet substrate 5 with the first terminal 41 overlaps with the pressure-sensitive adhesive sheet cutout portion 63 of the pressure-sensitive adhesive sheet 6. The other region of the sheet substrate 5 is bonded to the pressure-sensitive adhesive sheet 6.

Pressure-Sensitive Adhesive Sheet

The pressure-sensitive adhesive sheet 6 includes a pressure-sensitive adhesive sheet cutout portion 63 that forms a clearance between the first bus bar 31 and the sheet substrate 5. The pressure-sensitive adhesive sheet cutout portion 63 is formed in an overlapping region that overlaps with the terminal (the first terminal 41) provided within the contour of the lower surface of the electronic component 4. The pressure-sensitive adhesive sheet cutout portion 63 is in communication with an opening portion 62. The size, the formation area in the front-rear direction, the formation area in the right-left direction, and the formation region in the up-down direction of the pressure-sensitive adhesive sheet cutout portion 63 may be the same as those of the bus bar cutout portion 311.

The present invention is not limited to these examples given here. The scope of the present invention is indicated by the appended claims, and all changes that come within the meaning and range of equivalency of the claims are to be embraced within the scope. For example, it is possible to provide a circuit assembly that includes both a bus bar cutout portion and a pressure-sensitive adhesive sheet cutout portion.

LIST OF REFERENCE NUMERALS

1A Circuit assembly
2 Circuit substrate
20 Insulating substrate
22 Mounting through hole
23 Connecting through hole
3 Bus bar
31 First bus bar
311 Bus bar cutout portion
312 Recessed portion 313 Protruding portion
314 Thinly-formed portion
32 Second bus bar
4 Electronic component
40 Package
41 First terminal
42 Second terminal
43 Third terminal
5 Sheet substrate
51 Terminal conductor foil
52 Insulating layer
521 Opening portion
6 Pressure-sensitive adhesive sheet
61 Sheet substrate placement region
62 Opening portion
63 Pressure-sensitive adhesive sheet cutout portion
7 Solder

The invention claimed is:

1. A circuit assembly comprising:
a circuit substrate that has an upper surface and a lower surface, a circuit pattern has formed on the upper surface;
a plurality of bus bars that are connected to the circuit substrate, and are fixed to the lower surface, the plurality of bus bars being spaced apart from each other;
an electronic component that includes a package, the package having a package lower surface, the package disposed on the bus bars, and a terminal provided entirely within a contour of the package lower surface;
a sheet substrate that has one end connected to the terminal and another end disposed outside the contour of the package lower surface and connected to a connection target on the circuit substrate; and
a pressure-sensitive adhesive sheet that bonds the circuit substrate and the sheet substrate to the plurality of bus bars.

2. The circuit assembly according to claim 1,
wherein the bus bar includes a recessed portion that is formed in an overlapping region of the bus bar that overlaps with the terminal of the electronic component, the recessed portion reducing a height difference with respect to a surrounding region where the sheet substrate is not disposed.

* * * * *